US009871118B2

(12) United States Patent
Cheng et al.

(10) Patent No.: US 9,871,118 B2
(45) Date of Patent: Jan. 16, 2018

(54) SEMICONDUCTOR STRUCTURE WITH AN L-SHAPED BOTTOM PLATE (71) Applicant: International Business Machines Corporation, Armonk, NY (US)

(72) Inventors: Kangguo Cheng, Schenectady, NY (US); Wilfried E. Haensch, Somers, NY (US); Ali Khakifirooz, Los Altos, CA (US); Davood Shahrjerdi, Brooklyn, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/181,447

(22) Filed: Jun. 14, 2016

(65) Prior Publication Data
US 2016/0300956 A1 Oct. 13, 2016

Related U.S. Application Data (62) Division of application No. 14/496,442, filed on Sep. 25, 2014, now Pat. No. 9,397,094.

(51) Int. Cl.
*H01L 29/786* (2006.01)
*H01L 29/06* (2006.01)
(Continued)

(52) U.S. Cl.
CPC ............ *H01L 29/66666* (2013.01); *H01L 21/823412* (2013.01); *H01L 21/823418* (2013.01);
(Continued)

(58) Field of Classification Search
CPC ..... H01L 29/786; H01L 29/06; H01L 29/423; H01L 29/66; H01L 21/84; H01L 21/8234; H01L 27/088
(Continued)

(56) References Cited

U.S. PATENT DOCUMENTS 4,791,462 A  12/1988 Blanchard et al.
5,378,914 A  1/1995 Ohzu et al.
(Continued)

OTHER PUBLICATIONS

U.S. Appl. No. 14/496,442, entitled "Semiconductor Structure With an L-Shaped Bottom Plate", filed Sep. 25, 2014, pp. 1-22.
(Continued)

*Primary Examiner* — Sheng Zhu
(74) *Attorney, Agent, or Firm* — Isaac J. Gooshaw (57) ABSTRACT

A semiconductor structure having an electrical contact that is connected to source/drain structures of two different transistors. The semiconductor structure has a vertical channel and a source/drain semiconductor structure connected to the vertical channel such that the source/drain semiconductor structure has a vertical side that is substantially planar with a vertical side of the first vertical channel. The source/drain semiconductor structure extends horizontally from its vertical side farther than the first vertical channel extends from its vertical side such that a width of the source/drain is greater than a width of the first vertical channel. The first source/drain semiconductor structure is located on a layer of substrate and the vertical channel is perpendicular relative to the layer of substrate.

8 Claims, 8 Drawing Sheets (51) Int. Cl.

| | | |
|---|---|---|
| *H01L 21/84* | (2006.01) | |
| *H01L 27/088* | (2006.01) | |
| *H01L 21/8234* | (2006.01) | |
| *H01L 29/66* | (2006.01) | |
| *H01L 29/423* | (2006.01) | |
| *H01L 29/08* | (2006.01) | |
| *H01L 29/10* | (2006.01) | |
| *H01L 29/417* | (2006.01) | |
| *H01L 29/78* | (2006.01) | |

(52) U.S. Cl.
CPC ........ *H01L 21/823475* (2013.01); *H01L 21/823487* (2013.01); *H01L 21/84* (2013.01); *H01L 27/088* (2013.01); *H01L 29/0649* (2013.01); *H01L 29/0847* (2013.01); *H01L 29/1037* (2013.01); *H01L 29/41741* (2013.01); *H01L 29/42392* (2013.01); *H01L 29/66484* (2013.01); *H01L 29/66545* (2013.01); *H01L 29/7827* (2013.01); *H01L 29/78618* (2013.01); *H01L 29/78642* (2013.01); *H01L 29/78696* (2013.01)

(58) Field of Classification Search
USPC ............. 257/347, 328, 296, 329; 438/612
See application file for complete search history.

(56) References Cited

U.S. PATENT DOCUMENTS

| | | | |
|---|---|---|---|
| 5,627,393 A | | 5/1997 | Hsu |
| 5,739,057 A | | 4/1998 | Tiwari et al. |
| 6,504,201 B1 | | 1/2003 | Noble et al. |
| 6,750,095 B1 | | 6/2004 | Bertagnoll et al. |
| 7,034,336 B2 | * | 4/2006 | Willer .............. 257/60 |
| 9,397,094 B2 | | 7/2016 | Cheng et al. |
| 2005/0253143 A1 | | 11/2005 | Takaura et al. |
| 2006/0017088 A1 | | 1/2006 | Abbott et al. |
| 2007/0222074 A1 | | 9/2007 | Bakkers et al. |
| 2009/0166725 A1 | | 7/2009 | Lee |
| 2009/0261390 A1 | | 10/2009 | Moniwa et al. |
| 2010/0142257 A1 | * | 6/2010 | Masuoka ......... G11C 11/4023 365/149 |
| 2010/0237407 A1 | * | 9/2010 | Nojima .............. 257/329 |
| 2011/0101445 A1 | * | 5/2011 | Kim et al. ............ 257/328 |
| 2011/0223731 A1 | | 9/2011 | Chung et al. |
| 2011/0241105 A1 | | 10/2011 | Ren |
| 2011/0284939 A1 | * | 11/2011 | Chung et al. ......... 257/296 |
| 2013/0087842 A1 | * | 4/2013 | Kim et al. ............ 257/306 |
| 2016/0307892 A1 | | 10/2016 | Cheng et al. |
| 2016/0351689 A1 | | 12/2016 | Cheng et al. |

OTHER PUBLICATIONS

IBM Appendix P.: "List of IBM Patents or Patent Applications Treated as Related", Dated May 3, 2017, 2 pages.

\* cited by examiner

SEMICONDUCTOR STRUCTURE WITH AN L-SHAPED BOTTOM PLATE

BACKGROUND OF THE INVENTION

The present invention relates generally to the field of semiconductor devices, and more particularly to formation of channels attached to source/drain semiconductor structures.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques, and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

With continuous scale-down and shrinkage of real estate in a semiconductor wafer available for a single semiconductor device, engineers are daily faced with the challenge of how to meet the market demand for ever increasing device density. For sub-80 nm pitch patterning, one technique is to achieve twice the pattern density through a technique called sidewall imaging transfer (SIT), which is also known as sidewall spacer image transfer. In a conventional SIT process, a blanket deposition of spacer making material, such as dielectric material, is usually performed after the mandrel litho development and spacers are then made out of the blanket layer of spacer making material through a directional etching process.

SUMMARY

According to one embodiment of the present disclosure, a semiconductor structure is disclosed that comprises: an electrical contact that is connected to source/drain structures of two different transistors; a vertical channel and a source/drain semiconductor structure connected to the vertical channel such that the source/drain semiconductor structure has a vertical side that is substantially planar with a vertical side of the first vertical channel. The source/drain semiconductor structure extends horizontally from its vertical side farther than the first vertical channel extends from its vertical side such that a width of the source/drain is greater than a width of the first vertical channel. The first source/drain semiconductor structure is located on a layer of substrate and the vertical channel is perpendicular relative to the layer of substrate.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

Embodiments may include methods of forming "L" shaped vertical transistors. As described below in conjunction with FIGS. 1-8, a fin is formed such that the vertical side of the fin is aligned with the vertical side of a source/drain semiconductor structure to which it is connected. The method described below in conjunction with FIGS. 1-8 may be incorporated into typical semiconductor fabrication processes, such as fin field effect transistor (FinFET) fabrication processes described below in conjunction with FIGS. 1-8.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As used herein, semiconductor structures refer to one or more physical structures that comprise semiconductor devices.

The present invention will now be described in detail with reference to the Figures.

Figure 1:
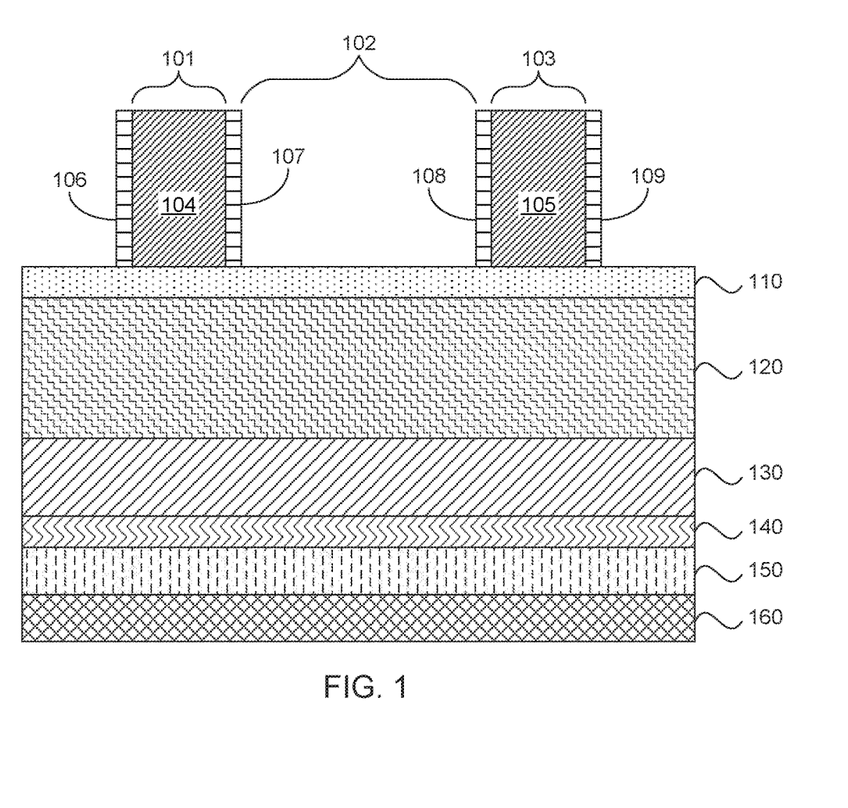
FIG. 1 illustrates a cross-sectional view depicting mandrels on a stack of layers from which the semiconductor devices of FIG. 5 are fabricated, in accordance with an exemplary embodiment of the present invention.
Figure 2A:
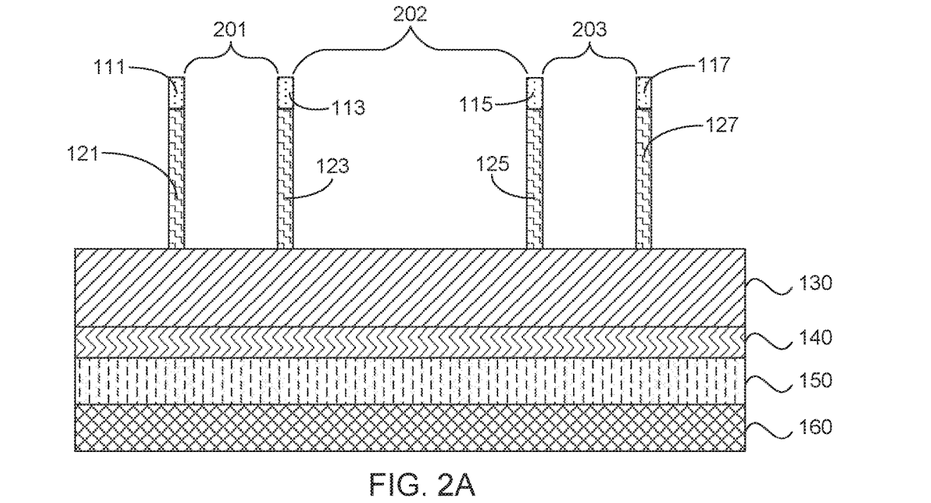
FIG. 2A illustrates a cross-sectional view depicting the formation of fins (vertical channels) of the semiconductor devices of FIG. 5, in accordance with an embodiment of the present invention.
Figure 5:
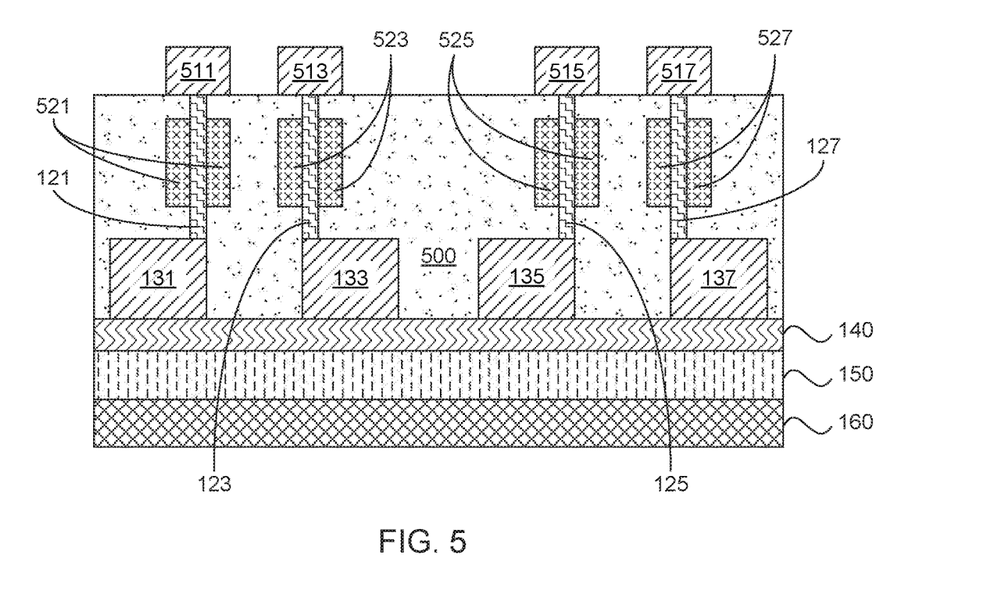
FIG. 5 illustrates a cross-sectional view depicting four vertical transistor semiconductor devices that have been formed using the "L" shaped semiconductor structures of FIG. 4B.

Referring now to FIG. 1, FIG. 1 illustrates a cross-sectional view depicting mandrels on a stack of layers from which the semiconductor devices of FIG. 5 are fabricated, in accordance with an exemplary embodiment of the present invention. FIG. 1 illustrates at least two mandrels (104, 105) are on a stack of layers including hard-mask layer 110, semiconductor layer 120, doped semiconductor 130, semiconductor-on-insulator layer (SOI) 140, buried oxide layer (BOX) 150, and substrate layer 160. In this embodiment, mandrel 104 and mandrel 105 are composed of amorphous silicon. Mandrel 104 and mandrel 105 respectively include two sidewall spacers (106, 107 and 108, 109). In this embodiment, such sidewall spacers are composed of silicon oxide. Mandrel 104 and 105 are positioned such that distance 102, the distance separating sidewall spacers 107 and 108, is substantially larger than either distance 101 or 103, which correspond to the distance separating sidewall spacers 106, 107 and sidewall spacers 108,109. In this embodiment, distance 101 and 103 are substantially similar in length. Further, in this embodiment, mandrel pitch of mandrel 104 and 105 are configured such that after sidewall imaging transfer (SIT), there will be intentional fin pitch walking. In other words, the mandrel pitch of mandrel 104 and 105 is configured such that, post SIT, distance 202 is substantially larger than either distance 201 or 203, as shown in FIG. 2A.

Referring to FIG. 1, in this embodiment, hard-mask layer 110 is comprised of silicon nitride. In other embodiments, hard-mask layer 110 comprises any material of combination of materials that will act as a protecting layer during the formation of a channel of a vertical channel of a transistor or another semiconductor structure of the like. In this embodiment, the semiconductor layer 120 is a layer of intrinsic semiconductor, also called an un-doped semiconductor or i-type semiconductor (e.g., doping concentration is less than $10^{16}$ cm$^{-3}$). In general, in this embodiment, semiconductor layer 120 is a semiconductor layer with a doping concentration significantly lower than the doping concentration of the doped semiconductor layer 130. The semiconductor layer 120 can be silicon, germanium, silicon germanium, or compound semiconductor such as III-V or II-V compound semiconductor materials. In one embodiment, the semiconductor layer 120 is an intrinsic semiconductor layer without any significant dopant species present. Doped semiconductor layer 130 is a doped with n-type dopants such as phosphorus and/or arsenic, or p-type dopants such as boron and/or indium. The doped semiconductor layer 130 can be silicon, germanium, silicon germanium, or compound semiconductor such as III-V or II-V compound semiconductor materials. In various embodiments, doped semiconductor layer 130 is any material that is suitable for use as a source or drain material of a transistor or another semiconductor structure of the like.

In this embodiment, SOI 140, BOX 150, and substrate layer 160 comprise a semiconductor-on-insulator wafer upon which the doped semiconductor layer 130 and the un-doped semiconductor layer 120 are epitaxially grown. Alternatively, the doped semiconductor layer 130 can be formed by other doping techniques such as ion implantation followed by activation anneal. This is followed by deposition of hard-mask layer 110. In general, SOI 140 is a semiconductor layer such as, for example, silicon, silicon germanium, or germanium. In general, BOX 150 is a layer of silicon dioxide or another like dielectric material that will reduce electrical current leakage from active semiconductor devices such as transistors. In this embodiment, substrate layer 160 is a support or "handle" layer at the bottom of the stack. In this embodiment, substrate layer 160 is a dielectric material. In some embodiments, substrate layer 160 may be a semiconductor material or a semiconductor on top of a dielectric material like a semiconductor-on-insulator (SOI) substrate.

Here, it is to be noted that the stack of layers 110-160, as being demonstratively depictured in FIG. 1, is one of many possible examples through which semiconductor devices may be formed. Other types of combination of dielectric and/or semiconductor layers may be used as well without deviating from the spirit of present invention.

FIG. 2A illustrates a cross-sectional view depicting the formation of fins of the semiconductor devices of FIG. 5, in accordance with an embodiment of the present invention. In this embodiment, the fins are formed by applying a sidewall imaging transfer (SIT) technique to the mandrels on a stack of layers of FIG. 1. The result of the application of the SIT technique is the formation of fins 121, 123, 125 and 127, which include a respective protective cap 111, 113, 115 and 117. In this embodiment, fins 121, 123, 125 and 127 are structures that form the channels of transistors (see FIGS. 5-8). The formation of fins using the processes of SIT techniques is well understood by those skilled in the art and, as such, a detailed description of such processes is not presented herein. However, the position of sidewall spacers 106, 107 and 108, 109 substantially correspond to the position of the resulting fins 121, 123, 125 and 127. As such, the resulting distance 202 separating fin 123 and fin 125 is substantially larger than either distance 201 or 203, which respectively separate fins 121, 123 and fins 125, 127.

Figure 2B:
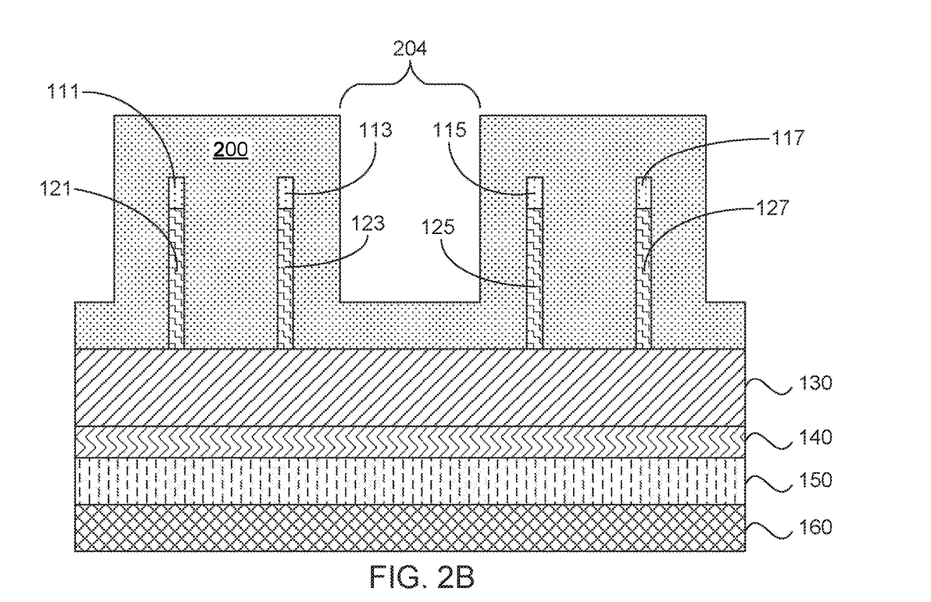
FIG. 2B illustrates a cross-sectional view depicting the deposition of a layer of filling material onto the semiconductor structures of FIG. 2A, in accordance with an embodiment of the present invention.

FIG. 2B illustrates a cross-sectional view depicting the deposition of a layer of filling material 200 onto the semiconductor structures of FIG. 2A. In this embodiment, filling material 200 is a conformal material, e.g., silicon oxide. In this embodiment, filling material 200 is conformally deposited using low pressure chemical vapor deposition (LPCVD) or atomic layer deposition (ALD) such that the resulting layer of filling material 200 completely fills the spaces between fins 121, 123 and fins 125,127. Note that the space between fins 123, 125 is not fully filled, but instead includes a gap (204). For example, distance 201 and 203 are 60 nm and distance 202 is 100 nm. Deposition of 30 nm thick layer of filling material 200 fills distance 201 and 203 but results in gap 204 being 40 nm wide.

Figure 3A:
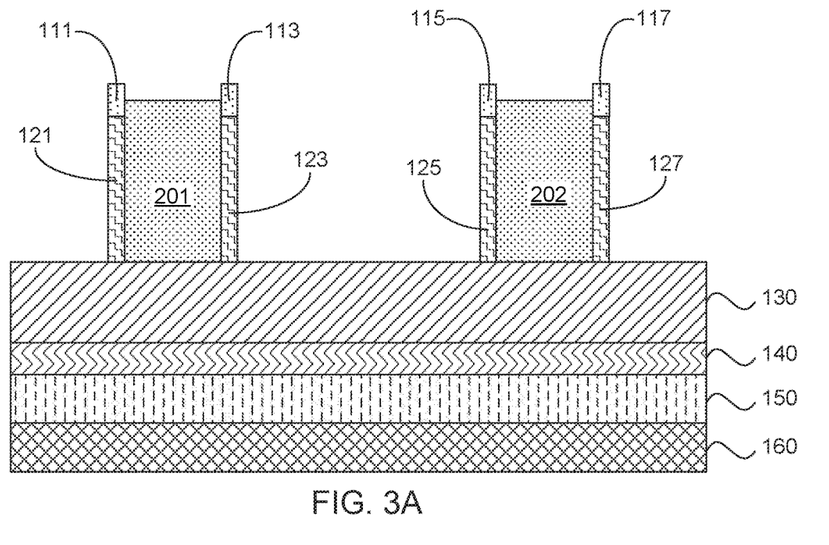
FIG. 3A illustrates a cross-sectional view depicting the removal of a portion of the layer of filling material, in accordance with an embodiment of the present invention.

FIG. 3A illustrates a cross-sectional view depicting the removal of a portion of the layer of filling material 200. The result of the removal is that the respective spaces between fins 121, 123 and fins 125, 127 are still filled with filling material 200, shown as filling material portions 201 and 202. In this embodiment, a chemical oxide removal (COR) etch is used to remove a portion of filling material 200. For example, filling material 200 is 40 nm thick. A 45 nm COR etch is applied to remove a portion of filling material 200. The etch results in the removal of a small portion of filling material 200 that is respectively between protective caps 111, 113 and protective caps 115, 117. However, this removal does not extend down to the filling material 200 that is respectively between fins 121, 123 and fins 125, 127.

Figure 3B:
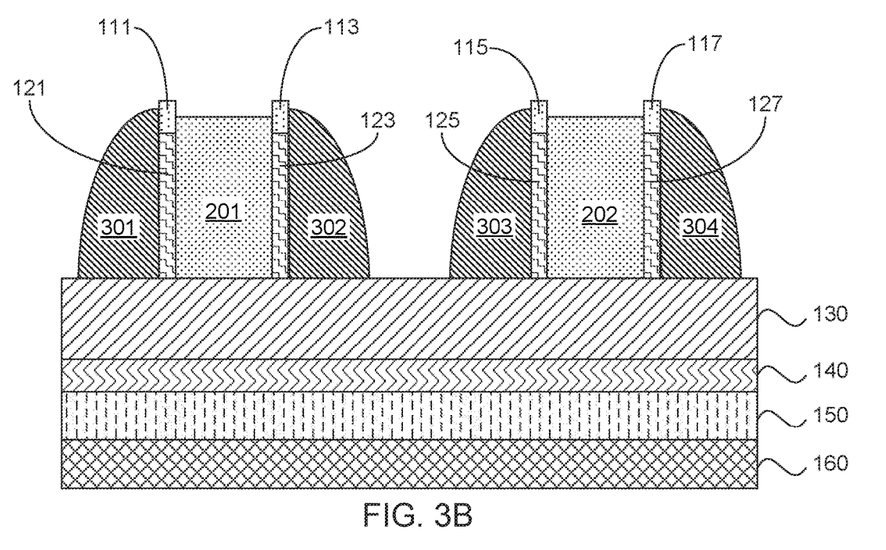
FIG. 3B illustrates a cross-sectional view depicting the formation of large pitch spacers, in accordance with an embodiment of the present invention.

FIG. 3B illustrates a cross-sectional view depicting the formation of large pitch spacers (301, 302, 303 and 304), in accordance with an embodiment of the present invention. In this embodiment, large pitch spacers 301, 302, 303 and 304 are amorphous carbon spacers formed from an amorphous carbon layer (ACL) that was deposited onto the semiconductor structures of FIG. 3A and then etched to form spacers (301, 302, 303 and 304), which abut fins 121, 123, 125 and 127 respectively. The formation of such amorphous carbon spacers is well understood by those skilled in the art and, as such, a more detailed description of such processes is not presented herein.

Figure 4A:
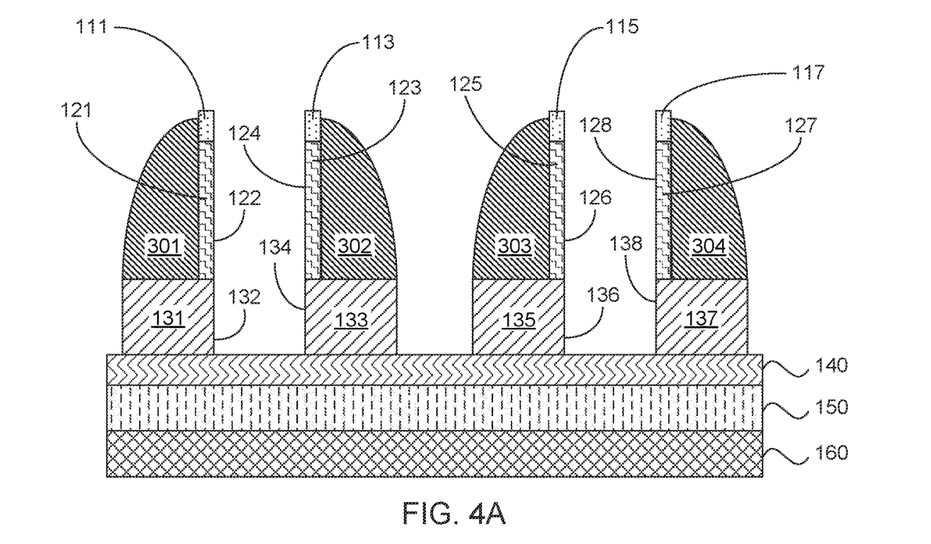
FIG. 4A illustrates a cross-sectional view depicting the removal of filling material portions as well as portions of n-silicon, in accordance with an embodiment of the present invention.

FIG. 4A illustrates a cross-sectional view depicting the removal of filling material portions 201 and 202 as well as portions of doped semiconductor layer 130. This removal results in the formation of source/drain (S/D) semiconductor structures 131, 133, 135 and 137. In this embodiment, the removal of filling material portions 201 and 202 as well as portions of doped semiconductor layer 130 is achieved using two different etching techniques. The first etch (e.g., a selective silicon oxide wet etching process) selectively removes filling material portions 201 and 202 and the second etch (e.g., reactive ion etching) removes portions of doped semiconductor layer 130 that are not protected by large pitch spacers 301, 302, 303 and 304. The techniques and application of selective etching is well understood by those skilled in the art and, as such, a more detailed description of such processes is not presented herein.

The removal of portions of doped semiconductor layer 130 that are not protected by large pitch spacers 301, 302, 303 and 304 results in the formation of S/D semiconductor structures 131, 133, 135 and 137, which respectively have S/D vertical sides 132, 134, 136 and 138 that are in substantial vertical planar alignment with fin vertical sides 122, 124, 126 and 128 of respective fins 121, 123, 125 and 127. The alignment of a vertical side of a fin with the vertical side of a source/drain semiconductor structure yields a distinctive "L" shape. Such a formation reduces the size of the source/drain semiconductor structure, which in turn increases the limit of packing density of vertical transistors (and like structures) that are created using such "L" shaped semiconductor structures.

Figure 4B:
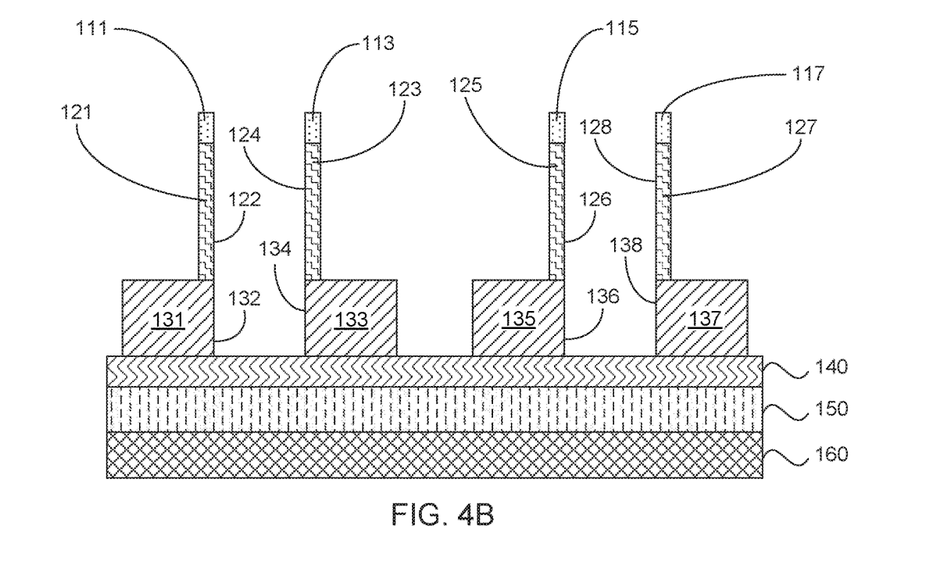
FIG. 4B illustrates a cross-sectional view depicting the removal of large pitch spacers, in accordance with an embodiment of the present invention.

FIG. 4B illustrates a cross-sectional view depicting the removal of large pitch spacers 301, 302, 303 and 304, in accordance with an embodiment of the present invention. The removal of large pitch spacers 301, 302, 303 and 304 further illustrates the "L" shape of the semiconductor structures shown in FIG. 4A (which respectively include a fin and a S/D semiconductor structure). In this embodiment, the selective removal of large pitch spacers 301, 302, 303 and 304 is accomplished using a reactive ion etching (REI) technique. The techniques and application of selective etching is well understood by those skilled in the art and, as such, a more detailed description of such processes is not presented herein.

FIG. 5 illustrates a cross-sectional view depicting four vertical transistor semiconductor devices that have been formed using the "L" shaped semiconductor structures of FIG. 4B. FIG. 5 depicts gate structures 521, 523, 525 and 527 respectively surrounding fins 121, 123, 125 and 127, further respectively. Gate structures 521, 523, 525 and 527 respectively include a layer of gate dielectric material (e.g., silicon dioxide, silicon nitride, silicon oxynitride, other dielectric material such as high-k, or any suitable combination of those materials) interposed between a layer of gate conducting material (e.g., doped silicon, metals, conducting metal compound materials, or any suitable combination of those materials) and respective fins 121, 123, 125 and 127. FIG. 5 further includes a layer of silicon nitride (500) and source/drain (S/D) semiconductor structures 511, 513, 515 and 517, which are respectively connected to fins 121, 123, 125 and 127. In this embodiment, S/D semiconductor structures 511, 513, 515 and 517 are composed of the same type of material as S/D semiconductor structures 131, 133, 135 and 137. Note that the present embodiment depicts the formation of four "L" shaped vertical transistor semiconductor devices. However, such techniques as described above in the discussions of FIGS. 1-4 can be modified to produce a range of "L" shaped semiconductor device with as few as one "L" shaped semiconductor device to many "L" shaped semiconductor devices.

As an example, and not by limitation, the semiconductor device of FIG. 5 is produced using the following process. A dielectric material (500) such as silicon nitride, silicon oxide, SiBCN, SiOCN, is deposited in two layers. The first layer of the dielectric material 500 is deposited such that it covers S/D semiconductor structures 131, 133, 135 and 137 and a lower portion of fins 121, 123, 125 and 127. A layer of gate dielectric material is deposited as well as a layer of gate material. Etching techniques are used to remove portions of the deposited layers gate dielectric material and gate material creating gate structures 521, 523, 525 and 527. The second layer of the dielectric material 500 is deposited to a depth that includes protective caps 111, 113, 115 and 117. The first and the second layers of the dielectric material 500 may comprise the same or different materials. A chemical mechanical polishing (CMP) technique is used to remove a portion of dielectric material 500 that includes protective caps 111, 113, 115 and 117 but does not substantially remove upper portions of fins 121, 123, 125 and 127. In an alternate example, selective etching is used to remove protective caps 111, 113, 115 and 117 in the case where the second layer of dielectric material 500 does not fully cover protective caps 111, 113, 115 and 117. A layer of source/drain material is deposited and then etched to form S/D semiconductor structures 511, 513, 515 and 517.

Figure 6:
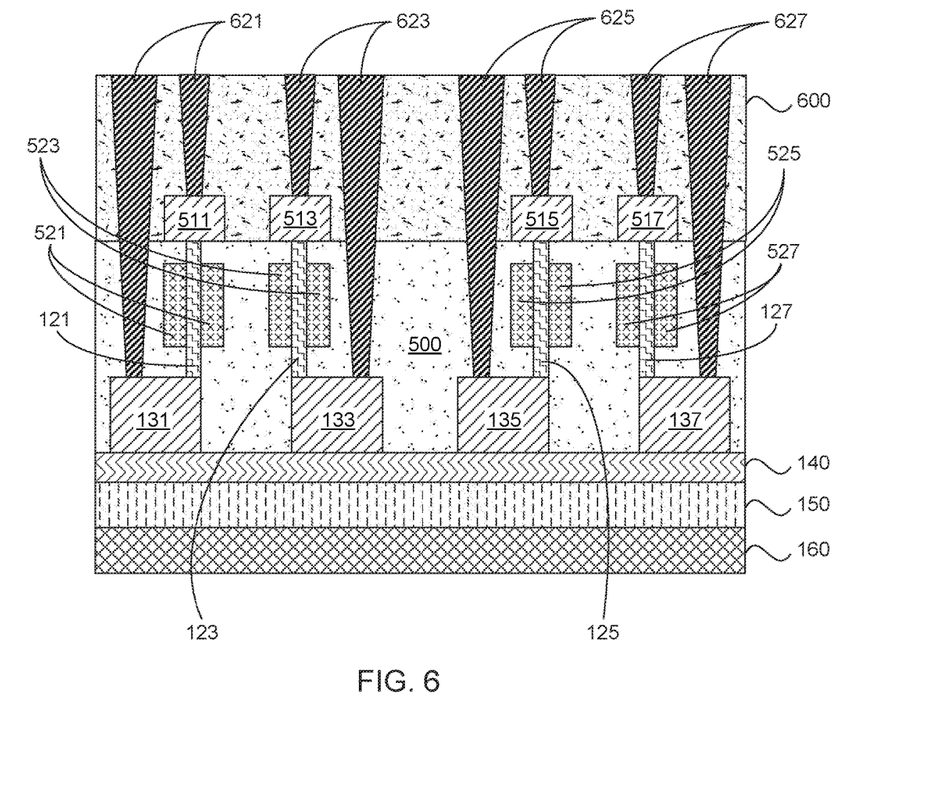
FIG. 6 illustrates a cross-sectional view depicting the semiconductor devices of FIG. 5, in accordance with one embodiment of the present invention.

FIG. 6 illustrates a cross-sectional view depicting the semiconductor devices of FIG. 5, in accordance with one embodiment of the present invention. FIG. 6 depicts a layer of interlayer dielectric material (600) covering the semiconductor devices of FIG. 5. A number of openings were etched through portions of one or both of interlayer dielectric material 600 and dielectric material 500. These openings were then filled with a contact material (such as tungsten, titanium, titanium nitride, copper, or any suitable combination of those materials), thereby forming contacts 621, 623, 625 and 627 that respectively form electrical connection with S/D semiconductor structures 131, 133, 135 137, 511, 513, 515 and 517, further respectively.

Figure 7:
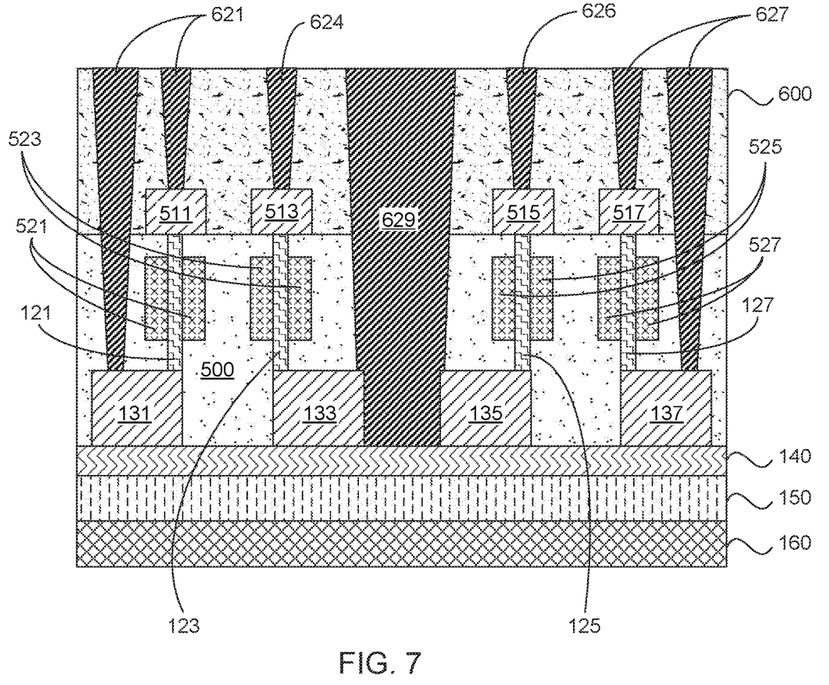
FIG. 7 illustrates a cross-sectional view depicting the semiconductor devices of FIG. 5, in accordance with one embodiment of the present invention.

FIG. 7 illustrates a cross-sectional view depicting the semiconductor devices of FIG. 5, in accordance with one embodiment of the present invention. FIG. 7 depicts a layer of interlayer dielectric material (600) covering the semiconductor devices of FIG. 5. A number of openings were etched through portions of one or both of interlayer dielectric material 600 and dielectric material 500. These openings were then filled with a contact material (such as tungsten, titanium, titanium nitride, copper, or any suitable combination of those materials), thereby forming contacts 621, 624, 626 and 627, and strap contact 629 that respectively form electrical connection with S/D semiconductor structures 131, 133, 135, 137, 511, 513, 515 and 517, further respectively. Note that strap contact 629 is connected to both of S/D semiconductor structures and 133 and 135.

Figure 8:
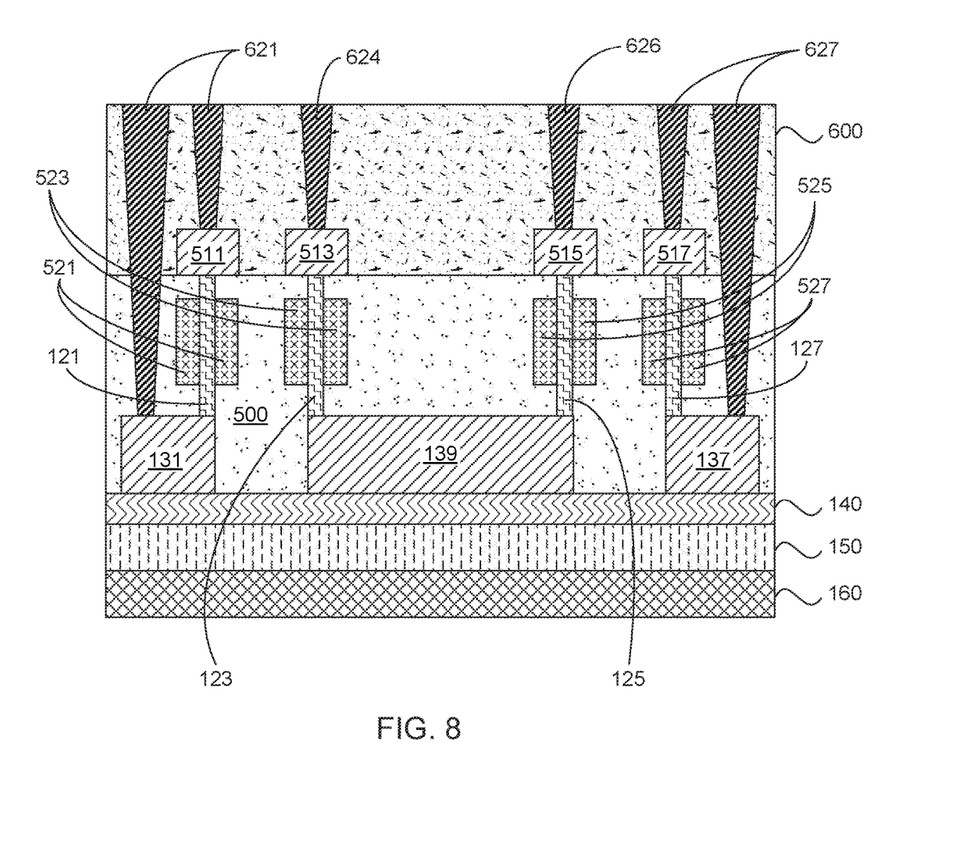
FIG. 8 illustrates a cross-sectional view depicting the semiconductor devices of FIG. 5, in accordance with one embodiment of the present invention.

FIG. 8 illustrates a cross-sectional view depicting the semiconductor devices of FIG. 5, in accordance with one embodiment of the present invention. FIG. 8 depicts a layer of interlayer dielectric material (600) covering the semiconductor devices of FIG. 5. A number of openings were etched through portions of one or both of interlayer dielectric material 600 and dielectric material 500. These openings were then filled with a contact material (such as tungsten, titanium, titanium nitride, copper, or any suitable combination of those materials), thereby forming contacts 621, 624, 626 and 627 that respectively form electrical connection with S/D semiconductor structures 131, 137, 139, 511, 513, 515 and 517, further respectively. Notice that S/D semiconductor structures 133 and 135 do not exist. Instead, a common S/D semiconductor structure exists that is connected to both fins 123 and 125. Such a structure could be used certain circuits, such as for a NAND gate structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

What is claimed is:

1. A semiconductor structure, the semiconductor structure comprising: an electrical contact that is connected to two different source/drain semiconductor structures of two different transistor structures that each have vertical channels; a first vertical channel included in one of the two different transistor structures; and a first source/drain semiconductor structure connected to the first vertical channel, wherein an end of the first vertical channel abuts a horizontal surface of the first source/drain semiconductor structure such that the first source/drain semiconductor structure has a vertical side that is substantially planar with a vertical side of the first vertical channel, the first source/drain semiconductor structure extending horizontally from the vertical side farther than the first vertical channel extends from the vertical side such that a length of the horizontal surface equals a width of the source/drain semiconductor structure as measured from the vertical side of the source/drain semiconductor structure to an opposite vertical side of the first source/drain semiconductor structure, wherein the width of the source/drain semiconductor structure is greater than a width of the first vertical channel, wherein the first source/drain semiconductor structure is located on a layer of substrate, and wherein the horizontal surface is parallel to the layer of substrate at a distance, the vertical channel being perpendicular relative to the layer of substrate, wherein a bottom surface of the source/drain semiconductor structure is in direct contact with a semiconductor-on-insulator (SOI) layer.

2. The semiconductor structure of claim 1, the semiconductor structure further comprising: a first gate structure that is in contact with at least a portion of the first vertical channel; and a first layer of dielectric material that covers the gate, the first source/drain semiconductor structure, and at least a portion of the first vertical channel.

3. The semiconductor structure of claim 1, the semiconductor structure further comprising:
a second source/drain semiconductor structure that is in contact with the first vertical channel wherein the first gate structure is interposed between the first source/drain semiconductor structure and the second source/drain semiconductor structure.

4. The semiconductor structure of claim 1, the semiconductor structure further comprising: a first electrical contact that is connected to the first source/drain semiconductor structure.

5. The semiconductor structure of claim 4, the semiconductor structure further comprising: a second layer of dielectric material that covers at least the first source/drain semiconductor structure, wherein the first electrical contact passes through at least a portion of the second layer of dielectric material.

6. The semiconductor structure of claim 1, the semiconductor structure further comprising:
a third source/drain semiconductor structure located on the layer of substrate;
a fourth source/drain semiconductor structure located on the layer of substrate;
a second vertical channel connected to third source/drain semiconductor structure, the third source/drain semiconductor structure having a vertical side that is substantially planar with a vertical side of the second vertical channel, the vertical side of the first vertical channel faces vertical side of the second vertical channel;
a third vertical channel connected to fourth source/drain semiconductor structure, the fourth source/drain semiconductor structure having a vertical side that is substantially planar with a vertical side of the third vertical channel.

7. The semiconductor structure of claim 6, the semiconductor structure further comprising:
the second vertical channel being interposed between the first vertical channel and the third vertical channel, a distance between the first vertical channel and the second vertical channel being substantially less than and a distance between the second vertical channel and the third vertical channel.

8. The semiconductor structure of claim 6, wherein the electrical contact that is connected to source/drain semiconductor structures of two different transistor structures comprises:
 a second electrical contact that is connected to both the third source/drain semiconductor structure and the fourth source/drain semiconductor structure.

\* \* \* \* \*